US012652831B2

(12) United States Patent
Nabuchi et al.

(10) Patent No.: US 12,652,831 B2
(45) Date of Patent: Jun. 9, 2026

(54) SEMICONDUCTOR DEVICE

(71) Applicant: RENESAS ELECTRONICS CORPORATION, Tokyo (JP)

(72) Inventors: Yuta Nabuchi, Tokyo (JP); Akihiro Shimomura, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 677 days.

(21) Appl. No.: 18/152,574

(22) Filed: Jan. 10, 2023

(65) Prior Publication Data
US 2023/0352521 A1 Nov. 2, 2023

(30) Foreign Application Priority Data
Apr. 27, 2022 (JP) ................................. 2022-073412

(51) Int. Cl.
*H10D 62/10* (2025.01)
*H10D 30/01* (2025.01)
*H10D 30/66* (2025.01)

(52) U.S. Cl.
CPC ....... *H10D 62/111* (2025.01); *H10D 30/0297* (2025.01); *H10D 30/668* (2025.01); *H10D 62/127* (2025.01)

(58) Field of Classification Search
CPC .. H10D 30/0297; H10D 30/668; H10D 30/60; H10D 84/83; H10D 62/111
See application file for complete search history.

(56) References Cited

U.S. PATENT DOCUMENTS

| | | | | |
|---|---|---|---|---|
| 6,468,847 | B1 * | 10/2002 | Disney | H10D 30/65 257/E29.256 |
| 7,161,208 | B2 * | 1/2007 | Spring | H10D 30/0297 257/E29.066 |
| 7,332,770 | B2 * | 2/2008 | Kobayashi | H10D 30/0295 257/E29.066 |
| 7,872,308 | B2 * | 1/2011 | Akiyama | H10D 62/393 257/349 |

(Continued)

FOREIGN PATENT DOCUMENTS

| | | |
|---|---|---|
| JP | 2017-139439 A | 8/2017 |
| JP | 2021-007129 A | 1/2021 |

OTHER PUBLICATIONS

Notice of Reasons for Refusal received in corresponding Japanese Patent Application No. 2022-073412, dated May 27, 2025.

*Primary Examiner* — Vincent Wall
(74) *Attorney, Agent, or Firm* — Rimon P.C.

(57) ABSTRACT
An improved power MOSFET having a super junction structure is disclosed. The improved power MOSFET includes a plurality of unit cells UC, and each of the plurality of unit cells UC includes a column region PC1, a column region PC2, a pair of trenches TR formed between the column regions PC1 and PC2 in the X-direction and a pair of gate electrodes GE formed in the pair of trenches TR via gate insulating films (GI). The pair of trenches TR and the pair of gate-electrodes GE extend in Y-direction in a plan view. A plurality of column regions PC1 are formed so as to be spaced apart from one another along the Y-direction, and a width(L1) of the column region PC1 in the Y direction is wider than a width(L2) of the column region PC1 in the X direction.

8 Claims, 14 Drawing Sheets

(56)          References Cited

U.S. PATENT DOCUMENTS

| | | | | |
|---|---|---|---|---|
| 8,008,717 | B2 * | 8/2011 | Kawashima | H10D 84/016 |
| | | | | 257/334 |
| 8,450,800 | B2 * | 5/2013 | Inomata | H10D 30/665 |
| | | | | 257/329 |
| 9,960,269 | B2 | 5/2018 | Yanagigawa et al. | |
| 10,903,322 | B2 * | 1/2021 | Meiser | H10D 30/668 |
| 12,125,905 | B2 * | 10/2024 | Kaya | H10D 62/393 |
| 2005/0006717 | A1 * | 1/2005 | Yamaguchi | H10D 62/393 |
| | | | | 257/E29.066 |
| 2006/0244056 | A1 * | 11/2006 | Miura | H10D 30/668 |
| | | | | 257/330 |
| 2008/0099837 | A1 * | 5/2008 | Akiyama | H10D 62/393 |
| | | | | 257/E29.066 |
| 2017/0222039 | A1 * | 8/2017 | Yanagigawa | H10D 62/111 |
| 2020/0411683 | A1 * | 12/2020 | Kaya | H10D 62/111 |

* cited by examiner

A-A cross section

A-A cross section

A-A cross section

A-A cross section

A-A cross section

Study Example 1

Study Example 2

SEMICONDUCTOR DEVICE

CROSS-REFERENCE TO RELATED APPLICATIONS

The disclosure of Japanese Patent Application No. 2022-073412 filed on Apr. 27, 2022, including the specification, drawings and abstract is incorporated herein by reference in its entirety.

BACKGROUND OF THE INVENTION

The present invention relates to a semiconductor device, and more particularly, to a semiconductor device and a method of manufacturing the same including a column region below a body region.

In a semiconductor device such as a power MOSFET (Metal Oxide Semiconductor Field Effect Transistor), a structure of a PN junction called a super junction structure (SJ structure) is known as a structure for improving a breakdown voltage. In an n-type MOSFET, a p-type column region is two-dimensionally arranged in an n-type drift region, so that the periphery of the column region is depleted and the breakdown voltage can be improved.

For example, Japanese unexamined Patent Application publication 2021-7129 proposes a multi-trench SJ configuration in which a pair of trench gates is provided in one unit cell. In Japanese unexamined Patent Application publication 2021-7129, since a column region is not provided between a pair of trench gates, a standardized on-resistance (Rsp) is reduced while increasing manufacturing variation is suppressed, and it discloses that a plurality of column regions formed around a pair of trench gates are arranged in a staggered manner.

SUMMARY OF THE INVENTION

As a method for further reducing the on-resistance and improving the performance of the semiconductor device, it is conceivable to increase an impurity concentration of a drift region and reduce a resistance of the drift region. However, in this case, if dimensions of the column region vary, variation in the breakdown voltage also increases. Therefore, since a semiconductor device with low reliability is easily manufactured, reduction in the resistance of the drift region is not suitable for mass production.

A main purpose of the present application is to provide a technique capable of improving the performance of the semiconductor device and ensuring the reliability of the semiconductor device by reducing the on-resistance without reducing the resistance of the drift region. Other objects and novel features will become apparent from the description of this specification and the accompanying drawings.

The typical ones of the embodiments disclosed in the present application will be briefly described as follows.

A semiconductor device according to an embodiment includes a plurality of unit cells. Each of the plurality of unit cells includes a semiconductor substrate having a drift region formed of a semiconductor layer of a first conductivity type, a body region of a second conductivity type opposite to the first conductivity type, formed on a surface of the drift region, a source region of the first conductivity type formed on a surface of the body region, a first column region and a second column region each of the first conductivity type formed in the drift region so as to be positioned under the body region and adjacent to and apart from each other in a first direction in a plan view, a pair of trenches formed between the first column region and the second column region in the first direction and formed in the drift region so that bottom portions of the pair of trenches reach a position deeper than the body region, and a pair of gate electrodes formed in the pair of trenches via a gate insulating film.

Wherein, the pair of trenches and the pair of gate electrodes extend in a second direction orthogonal to the first direction in a plan view, wherein a width of the first column region in the second direction is wider than a width of the first column region in the first direction, and wherein a plurality of first column regions are formed along the second direction and to space from one another.

A semiconductor device according to an embodiment includes a plurality of unit cells. Each of the plurality of unit cells includes a semiconductor substrate having a drift region formed of a semiconductor layer of a first conductivity type, a body region of a second conductivity type opposite to the first conductivity type, formed on a surface of the drift region, a source region of the first conductivity type formed on a surface of the body region, a first column region and a second column region each of the first conductivity type formed in the drift region so as to be positioned under the body region and adjacent to and apart from each other in a first direction in a plan view, a pair of trenches formed between the first column region and the second column region in the first direction and formed in the drift region so that bottom portions of the pair of trenches reach a position deeper than the body region, and a pair of gate electrodes formed in the pair of trenches via a gate insulating film.

Wherein, the pair of trenches and the pair of gate electrodes extend in a second direction orthogonal to the first direction in a plan view, wherein a width of the first column region in the second direction is wider than a width of the first column region in the first direction, wherein a plurality of first column regions are formed along the second direction and to space from one another, wherein a plurality of second column regions are formed along the second direction and to space from one another, wherein the plurality of first and second column regions are arranged in a staggered manner in a plan view, and wherein a part of selected one of the first column regions and a part of selected one of the second column regions are adjacent to each other in the first direction.

According to the embodiment, the performance of the semiconductor device can be improved and the reliability of the semiconductor device can be ensured.

DETAILED DESCRIPTION

Figure 1:
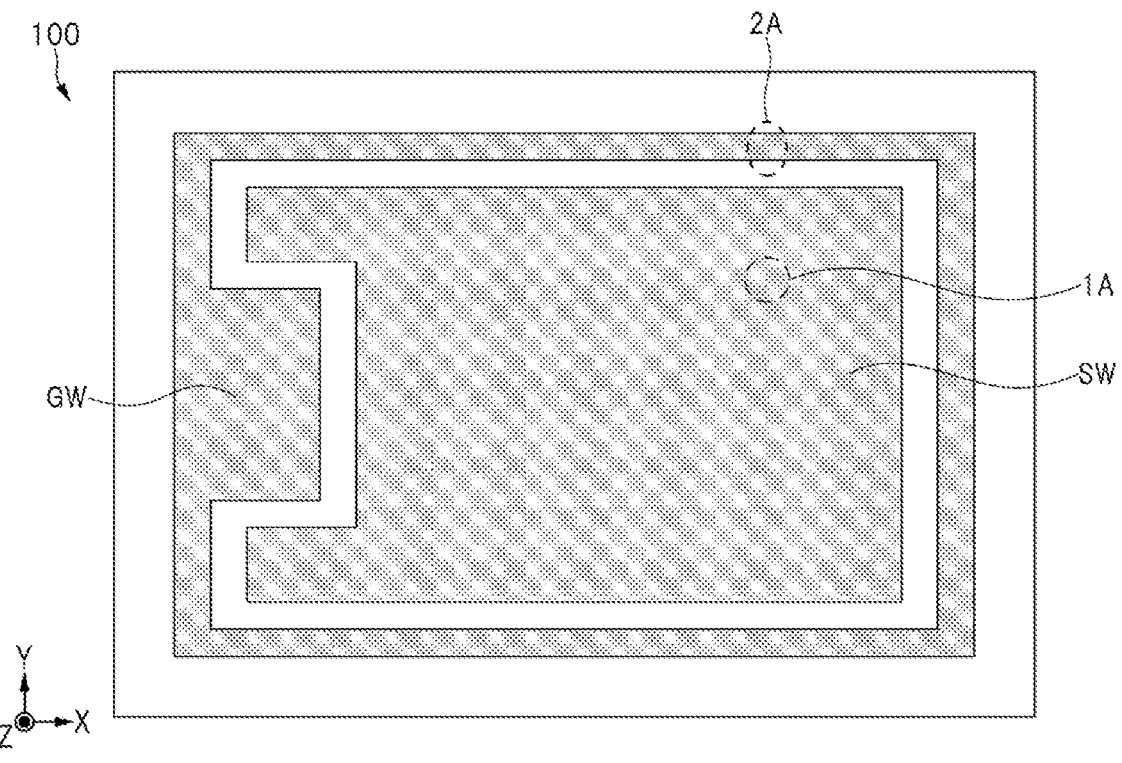
FIG. 1 is a plan view showing a semiconductor device of a first embodiment.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, X direction, Y direction, and Z direction described in the present application intersect each other and are orthogonal to each other. In the present application, the Z direction is described as a vertical direction, a height direction, or a thickness direction of a certain structure. In addition, an expression "plan view or plan figure" used in the present application means that a plane formed by the X direction and the Y direction is viewed from the Z direction.

A semiconductor device 100 according to the first embodiment will be described below with reference to FIGS. 1 to 4. FIG. 1 is a plan view of a semiconductor chip that is a semiconductor device 100.

As shown in FIG. 1, most of the semiconductor device 100 is covered with a source wiring SW, and a gate wiring GW is formed on the outer periphery of the source wiring SW. Although not illustrated here, the source-wiring SW and the gate-wiring GW are covered with a protective film PIQ. An opening is provided in a part of the protective film PIQ, and the source wiring SW and the gate wiring GW exposed in the opening serve as a source pad and a gate pad. External connection members such as wire bonding or clips (copper plates) are connected to the source pad and the gate pad, so that the semiconductor device 100 is electrically connected to another semiconductor chip, a wiring board, or the like.

Figure 2:
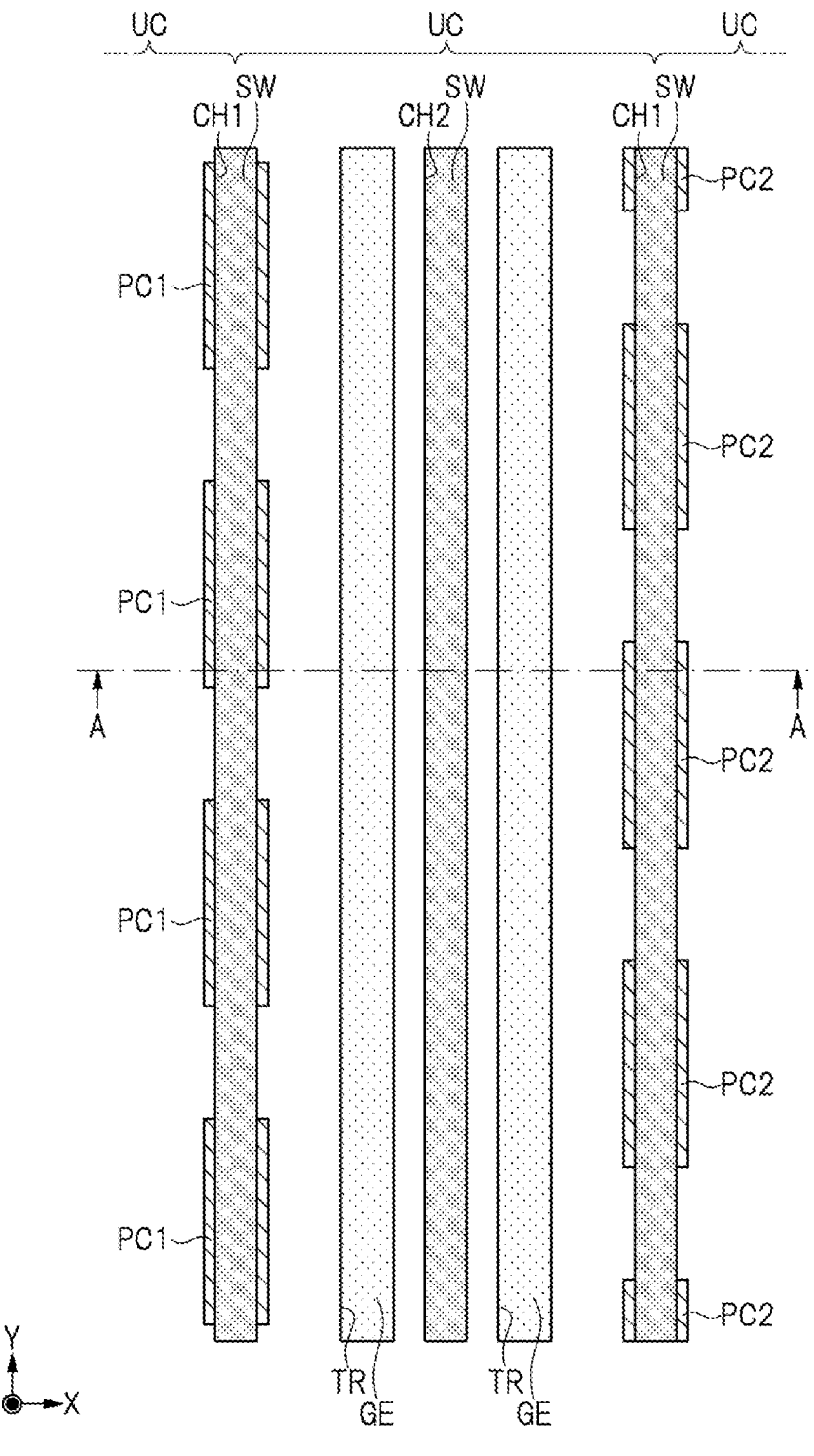
FIG. 2 is a main part plan view showing the semiconductor device of the first embodiment.
Figure 3:
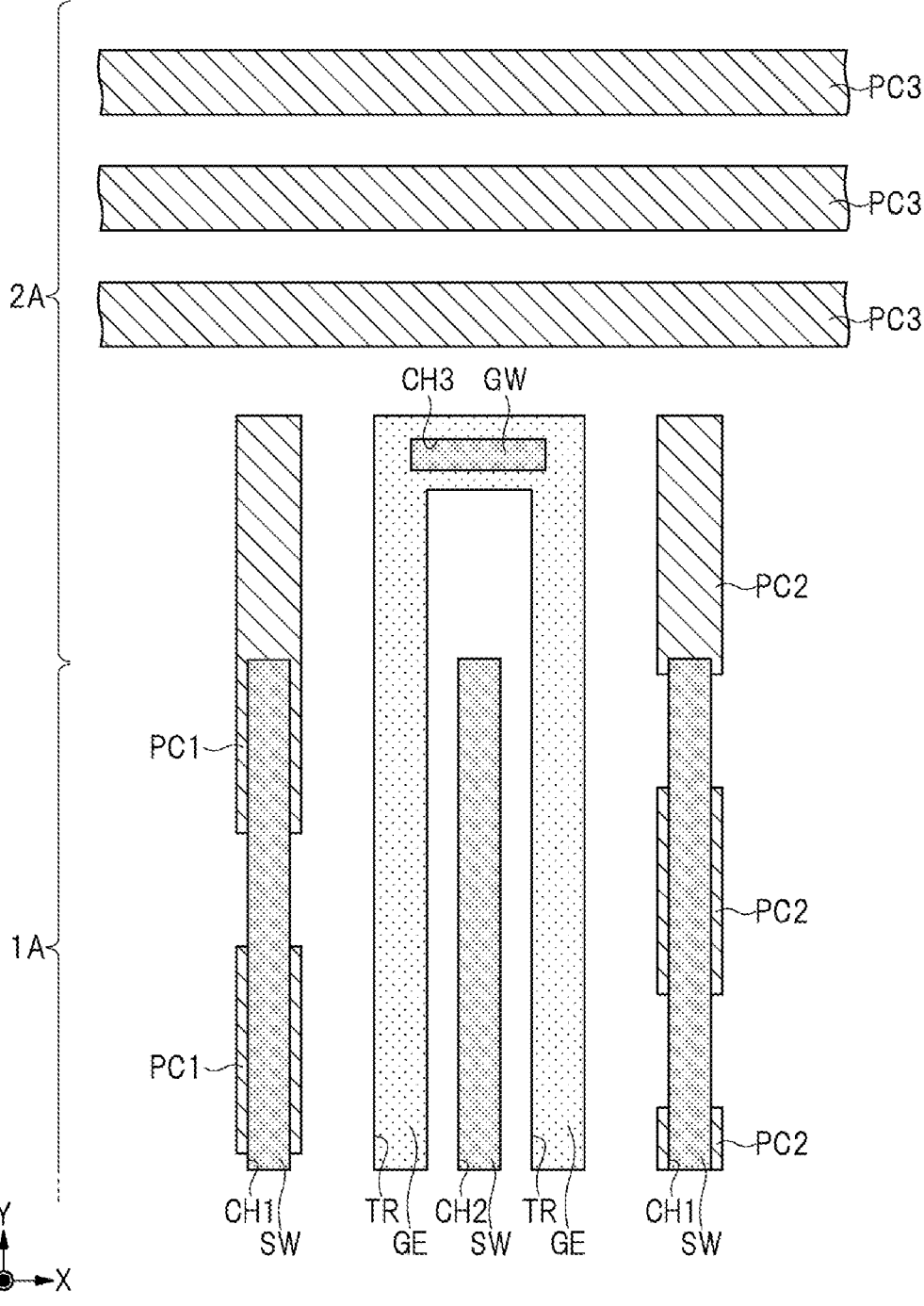
FIG. 3 is a main part plan view showing the semiconductor device of the first embodiment.
Figure 4:
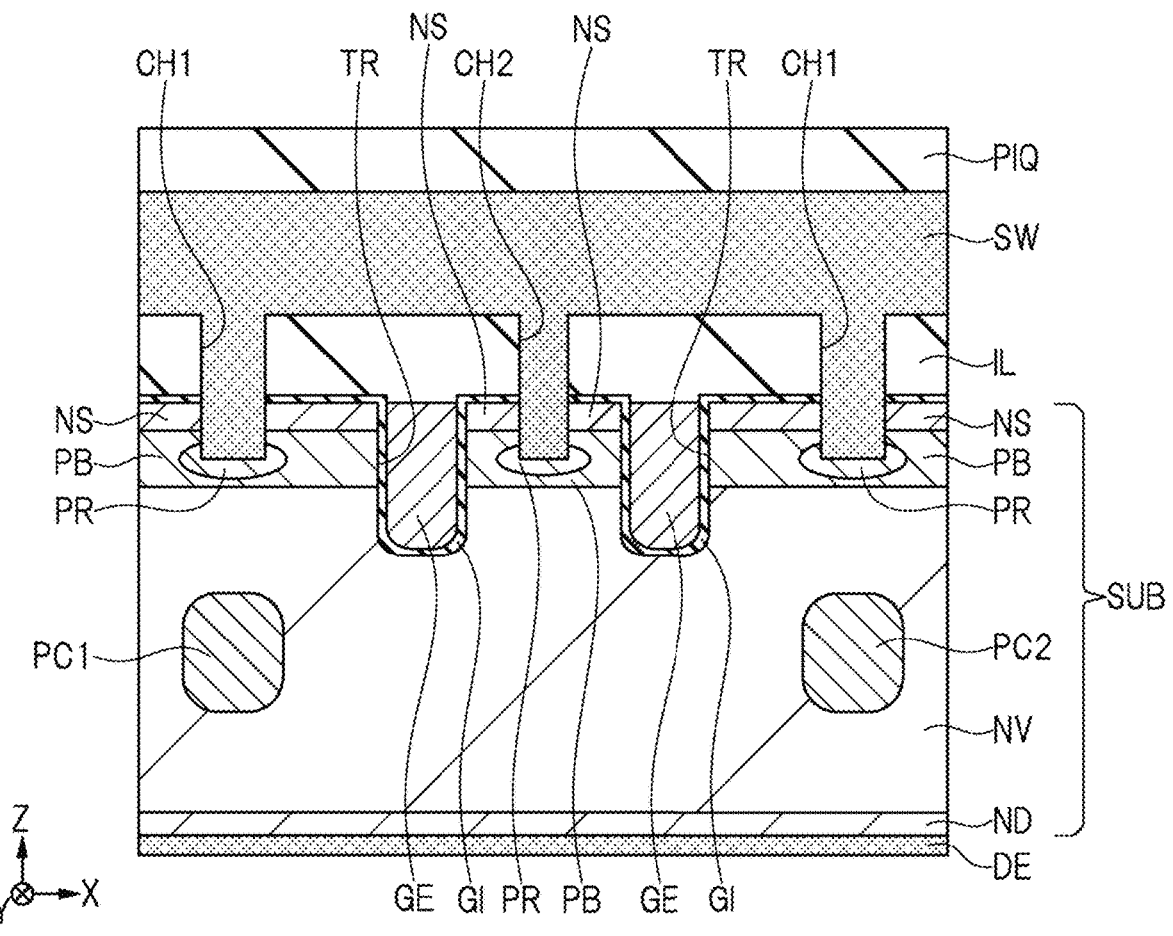
FIG. 4 is a cross-sectional view showing the semiconductor device in the first embodiment.

The cell region 1A illustrated in FIG. 1 is a region in which main semiconducting elements such as a power MOSFET are formed. The termination region 2A illustrated in FIG. 1 is a region surrounding the periphery of the cell region 1A, and is located on the outer periphery of the semiconductor device 100. FIG. 2 is an enlarged plan view of a part of the cell region 1A shown in FIG. 1. FIG. 3 is an enlarged plan view of a main part of the periphery of the termination region 2A shown in FIG. 1. FIG. 4 is a cross-sectional view along line A-A shown in FIG. 2.

As illustrated in FIG. 2, the semiconductor device 100 of the first embodiment includes a plurality of unit cells UC in the cell region 1A, and the unit cells UC have a multi-trench SJ configuration. The two unit cells UC adjoining each other in the X direction are arranged so that one of the column regions PC1, PC2 is folded back in common.

FIG. 4 shows a cross-sectional view of one unit cell UC of the device 100. The semiconductor substrate SUB is made of, for example, n-type silicon, and has a drift-region NV made of n-type semiconductor layer. Here, the n-type semiconductor substrate SUB itself constitute the drift region NV. The drift-region NV may be a stack of an n-type silicon substrate and a semiconducting layer on the n-type silicon substrate, the semiconducting layer is formed by epitaxial growth while introducing phosphorus (P). In the present application, such a stack is also described as being a semiconductor substrate SUB.

A p-type body region is formed on a surface of the drift region NV. An n-type source-region NS is formed on a surface of the body-region PB. The source region NS has a higher impurity concentration than the drift region NV.

P-type column regions PC1, PC2 are formed in the drift region NV so as to be located under the body region PB. The column regions PC1, PC2 are physically spaced from the body region PB in the Z-direction. Each column regions PC1, PC2 has a higher impurity concentration than the body region PB.

A pair of trenches TR are formed in the drift-region NV so that bottom portions of pair of trenches TR reach a position deeper than the body region PB. A pair of gate electrodes GE is formed in the pair of trenches TR via a gate insulating film GI. The gate insulating film GI is, for example, a silicon oxide film, and the gate electrode GE is, for example, a polycrystalline silicon film into which an n-type impurity is introduced.

An interlayer insulating film IL is formed on the semiconductor substrate SUB so as to cover the pair of gate-electrodes GE. A pair of holes CH1 and CH2 is formed in the interlayer insulating film IL. The pair of holes CH1 and CH2 penetrate through the interlayer insulating film IL and the source region NS such that the bottom portions thereof are located in the body region PB. Although not shown here, the hole CH3 shown in FIG. 3 is formed in the interlayer insulating film IL in the termination region 2A. The hole CH3 is located on the gate-electrode GE.

At the bottom of each of the pair of holes CH1 and CH2, a high concentration region PR having an impurity concentration higher than that of the body region PB is formed in the body region PB.

A source wiring SW is formed on the interlayer insulating film IL so as to fill the inside of the pair of holes CH1 and CH2. The source wiring SW is electrically connected to the source region NS, the body region PB, and the high concentration region PR, and supplies a source potential thereto. Although not illustrated here, a gate-wiring GW is also formed on the interlayer insulating film IL so as to fill the inside of the hole CH3. The gate wiring GW is electrically connected to the gate electrode GE and supplies a gate potential to the gate electrode GE. The source wiring SW and the gate wiring GW are formed of, for example, a barrier metal film such as a titanium nitride film and a main conductive film such as an aluminum film.

A protective film PIQ such as a polyimide film is formed on the source wiring SW and the gate wiring GW.

An n-type drain region ND and a drain electrode DE are formed on a back surface of the semiconductor-substrate SUB. The n-type drain region ND has a higher impurity concentration than the drift region NV. The drain electrode DE is electrically connected to the drain region ND, and supplies a drain potential to the drain region ND. The drain electrode DE comprises a single layer of metallic membranes, such as aluminum film, titanium film, nickel film, gold film or silver film, or a laminated film with these metallic films laminated accordingly.

The semiconductor device 100 can be applied to, for example, a high-side MOSFET and a low-side MOSFET included in DC/DC converters. When DC/DC converter is used as a motor drive circuit, a low-side MOSFET may be used as a diode by short-circuiting the gate electrode GE to the source-line SW. Here, an electromotive force generated from a motor (inductance) causes a voltage Vds to be applied between the source and the drain of MOSFET for the diode, an output capacitance changes, and a reverse-recovery current is generated. When the output capacitance is highly dependent on the voltage Vds, a reverse-recovery current is abruptly generated, which appears as noise. In order to reduce the noise, a snubber circuit (MIM capacitance) or the like may be mounted, but if the snubber circuit is provided, there is a problem that high-speed operation of MOSFET is limited.

Here, the column regions PC1, PC2 of the first embodiment are physically separated from the body region PB. Therefore, no source-potential is applied to the column region PC1, PC2, and the column regions PC1, PC2 have a floating structure. Note that the column regions PC1, PC2 may be physically in contact with the body region PB, but it is more preferable that the column regions PC1, PC2 are a floating structure.

In the case of the floating structure, the depletion layers generated from the column regions PC1, PC2 and the body region PB are separated at the time of thermal equilibrium (voltage Vds=0V). Therefore, the abrupt change in the output capacitance can be mitigated in positively biased (voltage Vds>0V) as compared with the case where the column regions PC1, PC2 are physically connected to the body region PB. Therefore, noise can be reduced without mounting the snubber circuit.

As shown in FIG. 2, in the cell region 1A, the column region PC1 and the column region PC2 are spaced apart from each other in the X-direction in a plan view. In the first embodiment, a plurality of column regions PC1 and a plurality of column regions PC2 are formed. The plurality of column regions PC1 are formed so as to be spaced apart from each other along the Y-direction. Similarly, the plurality of column regions PC2 are formed so as to be spaced apart from each other along the Y-direction.

The pair of trenches TR and the pair of gate-electrodes GE extend in the Y direction and are formed between the column region PC1 and the column region PC2 in the X direction. Each of the pair of holes CH1 extends in the Y-direction. One hole CH1 is provided at a position overlapping the column region PC1 in a plan view, and the other hole CH1 is provided at a position overlapping the column region PC2 in a plan view. The hole CH2 extends in the Y direction and is formed between the pair of gate-electrodes GE in the X direction. In the unit cell UC of the first embodiment, the pair of trenches TR are disposed closer to the hole CH2 than the hole CH1 in the X-direction.

As illustrated in FIG. 3, in the termination region 2A, the column region PC1 and the column region PC2 are not divided into a plurality of portions, and extend toward the outer periphery of the semiconductor device 100. In the termination region 2A, the pair of trenches TR are connected to each other, and the pair of gate electrode GE are also connected to each other. The hole CH3 is arranged so as to overlap the connecting portion of the gate electrode GE. A gate wiring GW is embedded in the hole CH3.

Here, although the pair of trenches TR and the pair of gate electrodes GE of one unit cell UC are connected, the respective trenches TR and the gate electrodes GE of the plurality of adjacent unit cells may be connected together.

In the termination region 2A, a plurality of column regions PC3 are formed. The plurality of column regions PC3 are formed along the outer periphery of the semiconductor device 100 and surround the cell regions 1A. That is, in FIG. 3, the plurality of column regions PC3 extend in the X direction, but the plurality of column regions PC3 also extend in the Y direction. Note that the impurity and the impurity concentration constituting the column region PC3 are the same as those of the column regions PC1, PC2.

A Study Example, a Main Feature of the First Embodiment

Figure 6:
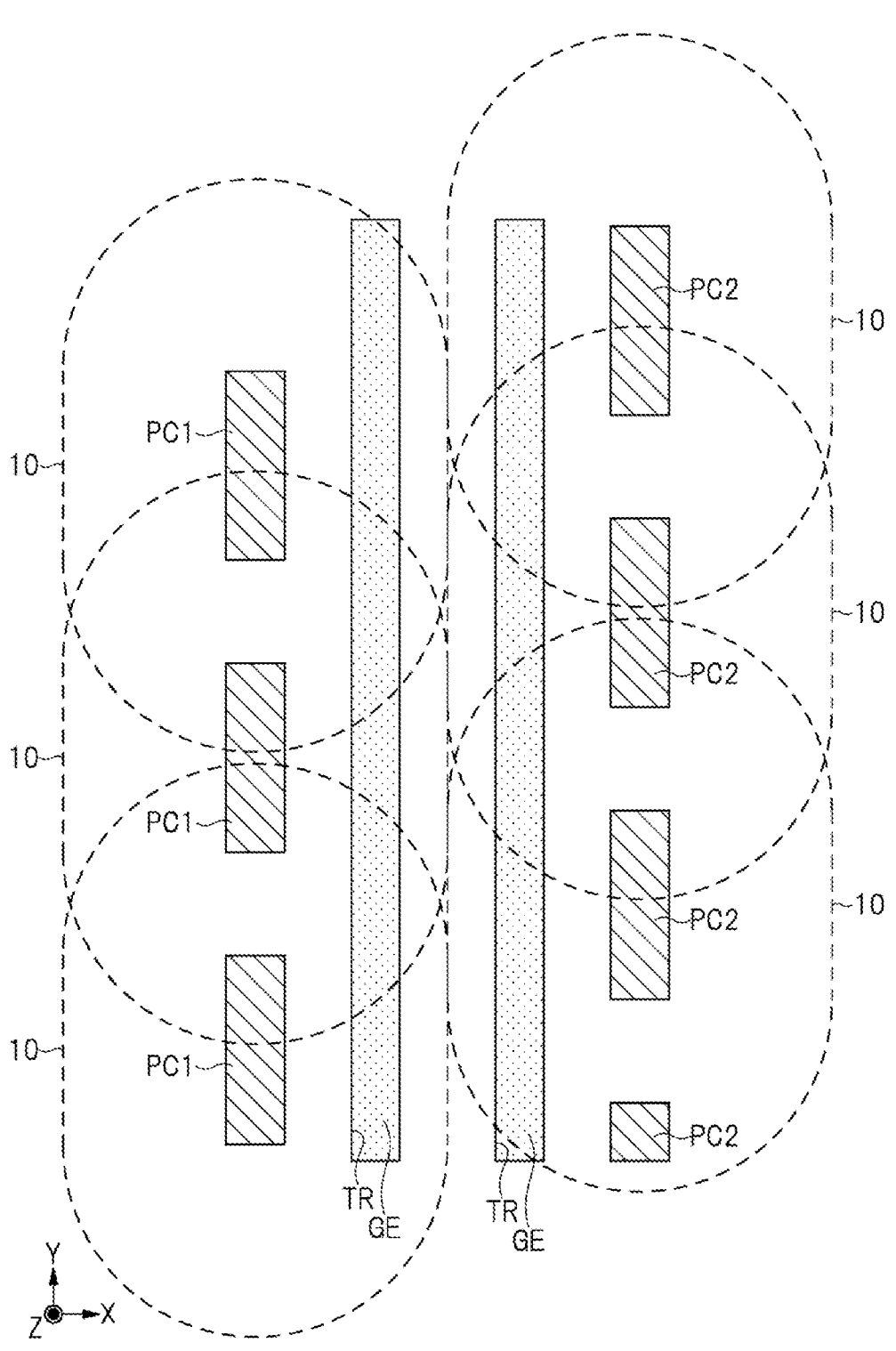
FIG. 6 is a main part plan view showing the semiconductor device in the first embodiment.
Figure 13:
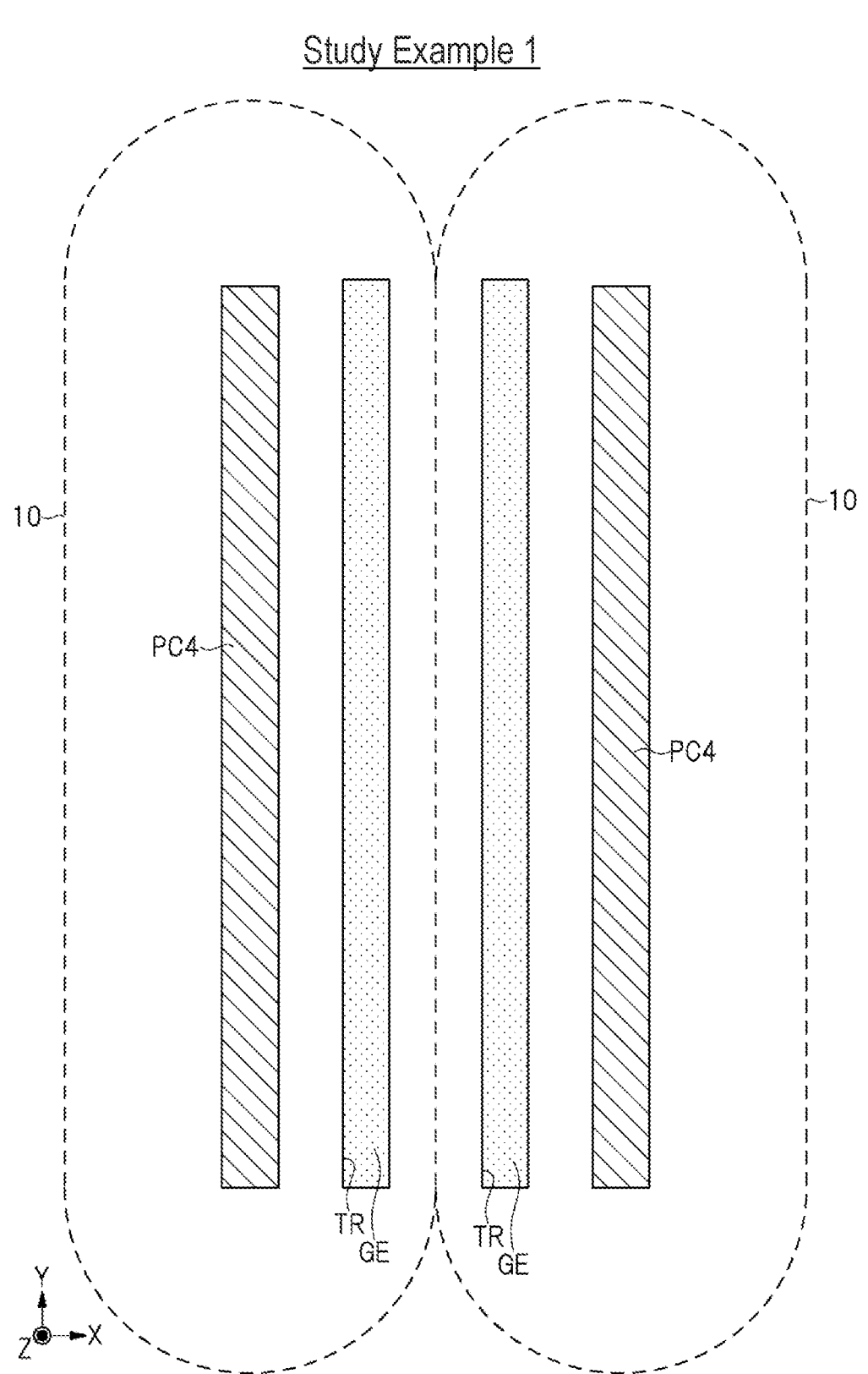
FIG. 13 is a main part plan view showing a semiconductor device in Study Example 1.
Figure 14:
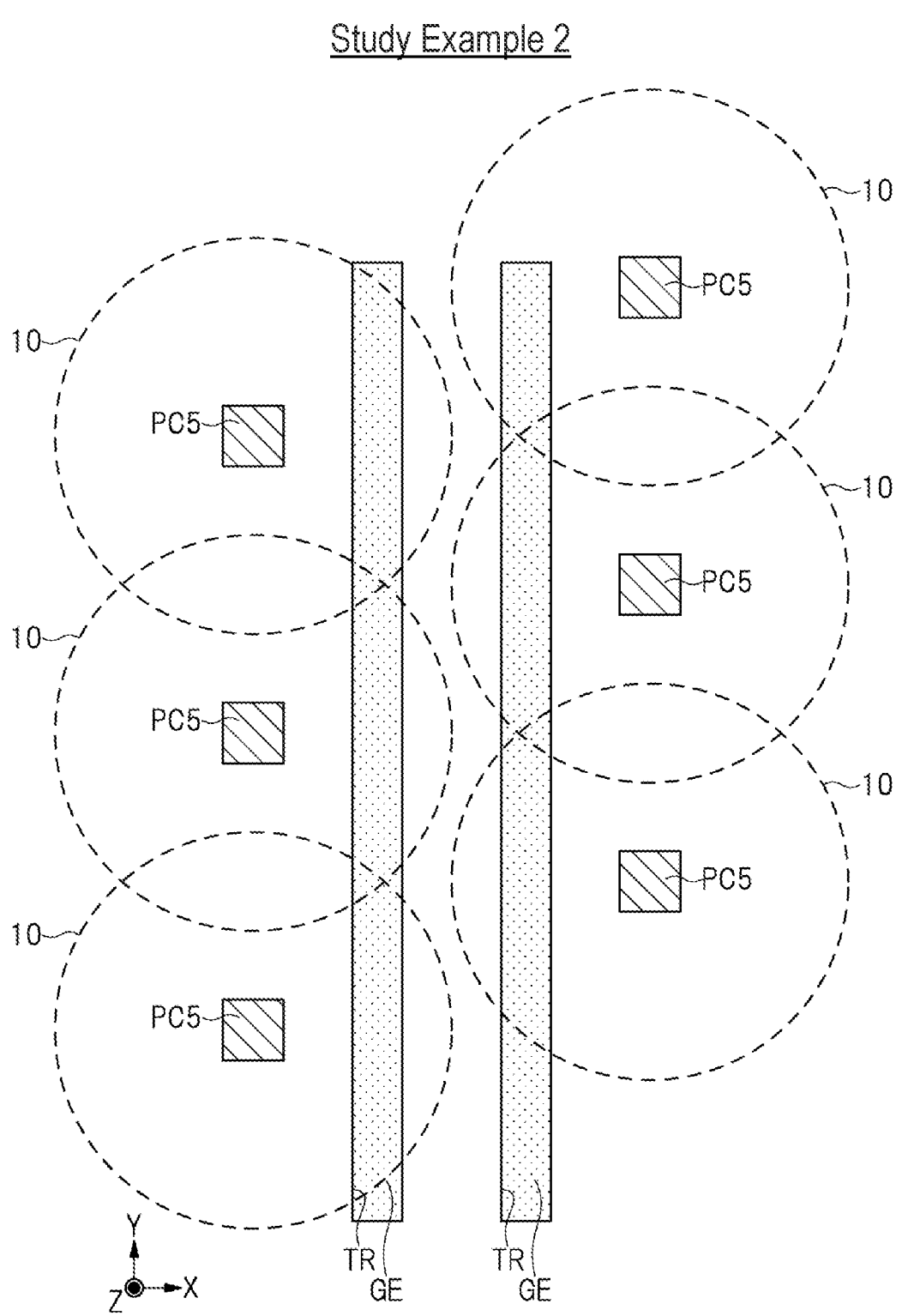
FIG. 14 is a main part plan view showing a semiconductor device in Study Example 2.

With reference to FIGS. 13 and 14 below, the present inventors will be described Study Example 1 and Study Example 2 has been studied. Next, the main feature of the first embodiment will be described with reference to FIG. 13 and FIG. 14. Note that FIG. 13, FIG. 14, and FIG. 6 show a state in which the depletion layer is sufficiently extended from each column region.

As shown in FIG. 13, in Study Example 1, the column region PC4 is striped (extending in the Y-direction). Here, in order to reduce the on-resistance and improve the performance of the semiconductor device 100, it is conceivable to increase the impurity concentration of the drift region NV and reduce the resistance of the drift region NV. However, if the dimension of the column region varies, the breakdown voltage also increases as the impurity concentration of the drift region NV increases. Therefore, there is a problem that the semiconductor device 100 with low reliability is easily manufactured.

Also, electronics flow from the source region NS to the drain region ND through the drift region NV between the two stripe-shaped column regions PC4 (current path). Here, since the column region PC4 extends in the Y-direction, the current path is easily concentrated at a particular position.

Study Example 2 was conducted by the inventors of the present application referring to Japanese unexamined Patent Application publication 2021-7129 in order to reduce the on-resistance compared to Study Example 1 without reducing the resistance of the drift-region NV. As shown in FIG. 14, in Study 2, the column region PC5 is not stripe-shaped, but is divided into a plurality of dots. Each of the plurality of column regions PC5 has a substantially square shape and is arranged in a staggered manner.

Note that the impurities and the impurity concentrations constituting the column regions PC4, PC5 in the Study Examples 1 and 2 are the same as those in the column regions PC1, PC2.

By dividing the column regions PC5 into a plurality of sections, the concentration of the current path is reduced as compared with the Study Example 1. That is, since the current path can be substantially increased, the on-resistance can be reduced. However, if the column regions PC5 are divided into a plurality of regions and the plurality of column regions PC5 are simply arranged, as shown in FIG. 14, there is a portion that is not depleted. Therefore, there is a problem that the breakdown voltage decreases and the reliability of the semiconductor device 100 decreases.

As a method for eliminating a portion that is not depleted, it is conceivable to enlarge the plane dimensions of each column region PC5 in the X direction and the Y direction, and to bring each column region PC5 close to the vicinity of the trench TR, for example. However, in this case, although the breakdown voltage can be improved, it becomes difficult to improve the on-resistance.

The semiconductor device 100 according to the first embodiment has been devised in consideration of the problems of the Study Example 1 and the Study Example 2. The main feature of the first embodiment will be described below with reference to FIG. 5 and FIG. 6.

Figure 5:
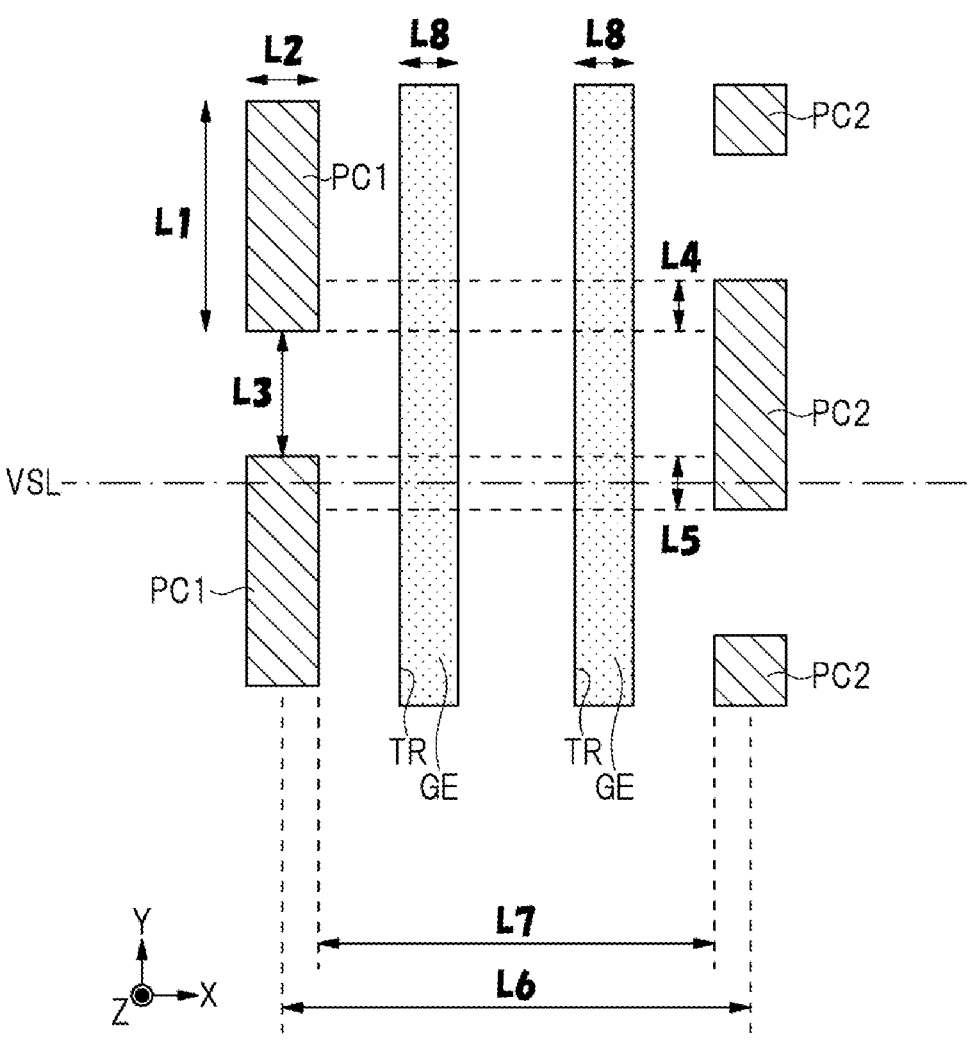
FIG. 5 is a main part plan view showing the semiconductor device in the first embodiment.

As shown in FIGS. 5 and 6, in the first embodiment, a plurality of column regions PC1 and a plurality of column regions PC2 are formed while being spaced apart from each other along the Y-direction. Although this point is the same as that of the Study Example 2, in the first embodiment, contrivance is applied to the planar dimensions and the arrangement interval of the plurality of column regions PC1 and the plurality of column regions PC2.

These relationships will be described below with reference to FIG. 5. In the following description, the width L1, the width L2, and the distance L3 will be described as representatives of the column region PC1, but the same applies to the column region PC2.

In the first embodiment, the column region PC1 in the Y direction has a width L1 that is larger than the width L2 of the column region PC1 in the X direction. In addition, the distance L3 at which the plurality of column regions PC1 are spaced apart from each other is shorter than the width L1. The width L1 is greater than or equal to twice the width L2, e.g., 1.5 to 3 μm. L2 is, for example, from 0.4 to 0.6 μm. The distance L3 is, for example, 1.0 to 1.4 μm.

By dividing the column region PC1 into a plurality of pieces and setting the appropriate distance L3 between the plurality of column regions PC1, the concentration of the current path is reduced. That is, since the current path can be substantially increased, the on-resistance can be reduced. Further, by making the width L1 of the column region PC1 wider along the extension direction of the trench TR, it is possible to suppress the possibility that a portion that is not depleted as in Study Example 2 is generated.

The plurality of column regions PC1 and the plurality of column regions PC2 are arranged in a staggered manner in a plan view. In addition, a part of one column region PC1 and a part of one column region PC2 adjoin each other in the X-direction. In FIG. 5, these neighboring distances are shown as distance L4 and distance L5. The distance L4 and the distance L5 are, for example, 0.3 to 0.51 μm, respectively. The distance L4 and the distance L5 are preferably the same value, but may be different values.

Note that the adjacency between the column region PC1 and the column region PC2 described above can also be paraphrased as follows. For example, when the virtual straight line VSL is drawn along the X-direction in the cell region 1A, the virtual straight line VSL always passes through the column region PC1, the column region PC2, or both. That is, the virtual straight line VSL may pass through only one column region PC1, the virtual straight line VSL may pass through only one column region PC2, or the virtual straight line PC1 may pass through one column region PC2.

As shown in FIG. 6, by dividing the column region PC1 into a plurality of portions, there is a portion where the depletion layer 10 cannot sufficiently spread from between the two column regions PC1 toward the trench TR. This point is the same as in Study Example 2 of FIG. 14, but by not only adopting the staggered arrangement but also appropriately setting the distance L4 and the distance L5, the depletion to the place can be compensated by the depletion layer 10 from the column region PC2.

Further, in FIG. 5, the pitch of the unit cells UC is shown as a distance L6, the distance between the column region PC1 and the column region PC2 in the X direction is shown as a distance L7, and the width of each of the pair of trench TR in the X direction is shown as a width L8. The distance L6 is, for example, 1.6 to 2.0 μm. The distance L7 is, for example, 1.1 to 1.5 μm. L8 is, for example, from 0.2 to 0.4 μm. The relationship between these elements and the distance L3 in which the plurality of column regions PC1 are separated from each other will be described.

If the depth of the trench TR is shallow, it needs to be depleted including the drift-region NV located at the bottom of the trench TR. Therefore, it is preferable that the relationship "distance L3<distance L7" is satisfied. When the depth of the trench TR is very deep, the distance L3 is preferably longer than the distance L7 minus the width L8 of each of the pair of trench TR. That is, it is preferable that the relationship "distance L7−2×width L8<distance L3" is satisfied.

To summarize the above, in the first embodiment, by dividing the column regions PC1, PC2 into a plurality, the concentration of the current path is reduced as compared with the Study Example 1. Therefore, since the current path can be substantially increased, the on-resistance can be reduced without reducing the resistance of the drift-region NV. On the other hand, since the overall expansion of the depletion layer 10 can be substantially the same as that of the Study Example 1, sufficient breakdown voltage can be ensured. That is, according to the first embodiment, it is possible to improve the performance of the semiconductor device 100 and ensure the reliability of the semiconductor device 100.

Hereinafter, a method of manufacturing the semiconductor device 100 according to the first embodiment will be described with reference to FIGS. 7 to 11. FIG. 7 to FIG. 11 are cross-sectional views taken along A-A line of FIG. 2, similar to FIG. 4, illustrating a process for manufacturing one unit cell UC.

Figure 7:
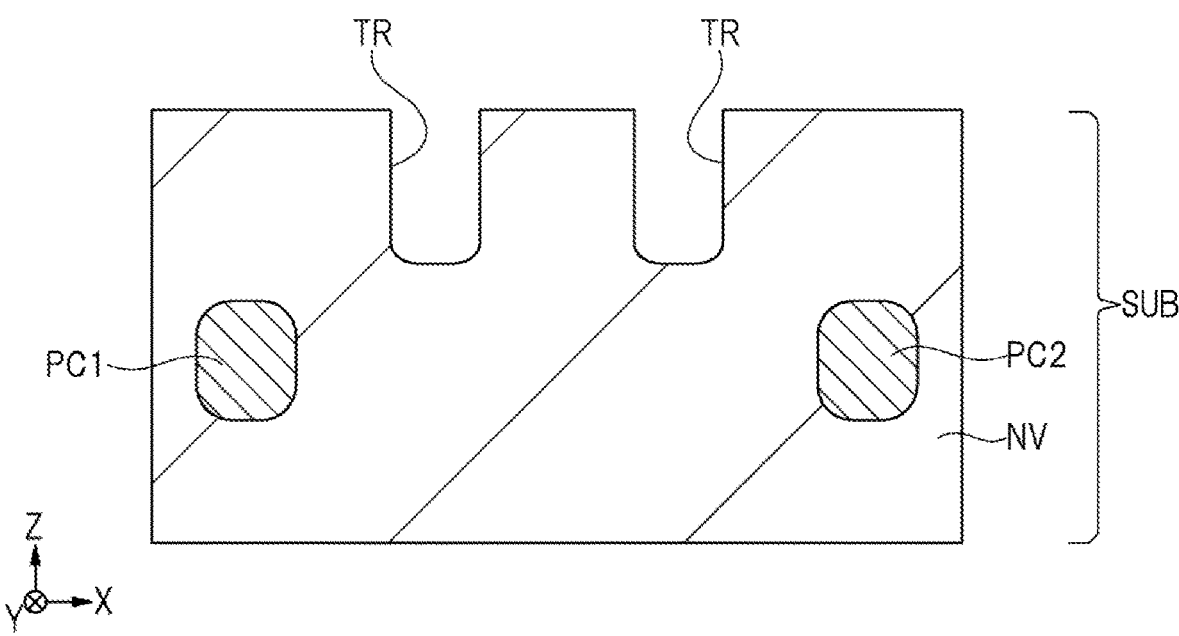
FIG. 7 is a cross-sectional view showing a manufacturing process of the semiconductor device in the first embodiment.

As shown in FIG. 7, first, a semiconductor substrate SUB having a drift-region NV formed of an n-type semiconductor layer is prepared. Next, a pair of trench TR is formed in the drift-region NV by a photolithography technique and a dry etching process. Next, a p-type impurity such as boron (B) is introduced by a photolithography technique and an ion-implantation method to form p-type column regions PC1, PC2 in the drift region NV. Note that a column region PC3 shown in FIG. 3 is also formed in the termination region 2A by the same step as the step of forming the column regions PC1, PC2.

In the first embodiment, the column regions PC1~PC3 are formed only by changing the mask pattern as compared with the Study Example 1 and the Study Example 2, so that there is no need to add a new manufacturing process.

Figure 8:
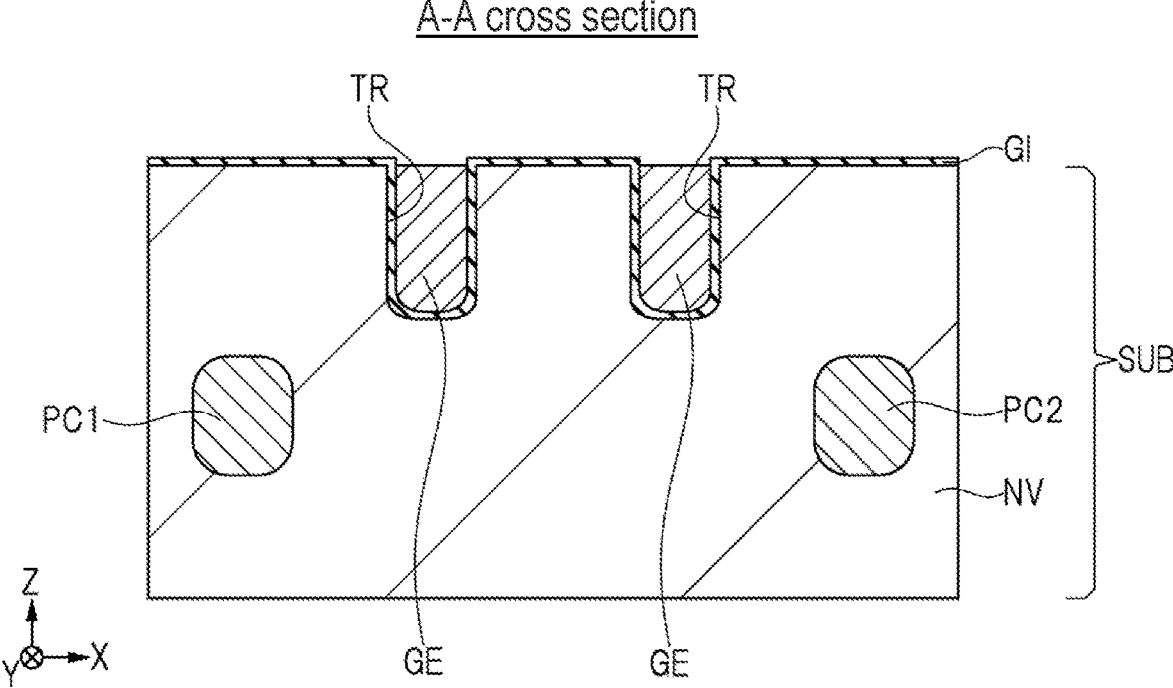
FIG. 8 is a cross-sectional view showing a manufacturing process following FIG. 7.

As shown in FIG. 8, a pair of gate electrodes GE is formed in the pair of trenches TR via a gate insulating film GI, respectively. First, the gate-insulating film GI made of a silicon-oxide film is formed on a semiconductor substrate SUB including a pair of trench TR by, for example, a thermal oxidation method.

Next, a polycrystalline silicon film in which, for example, n-type impurities are introduced is formed on the semiconductor substrate SUB by, for example, CVD(Chemical Vapor Deposition) so as to fill in the pair of trenches TR via the gate-insulating film GI. Next, the polycrystalline silicon film located outside the pair of trench TR is removed by a polishing process or a dry-etching process using, for example, CMP(Chemical Mechanical Polishing). Note that the gate insulating film GI located outside the pair of trench TR may be removed by, for example, a wet etching process, or may be left.

Figure 9:
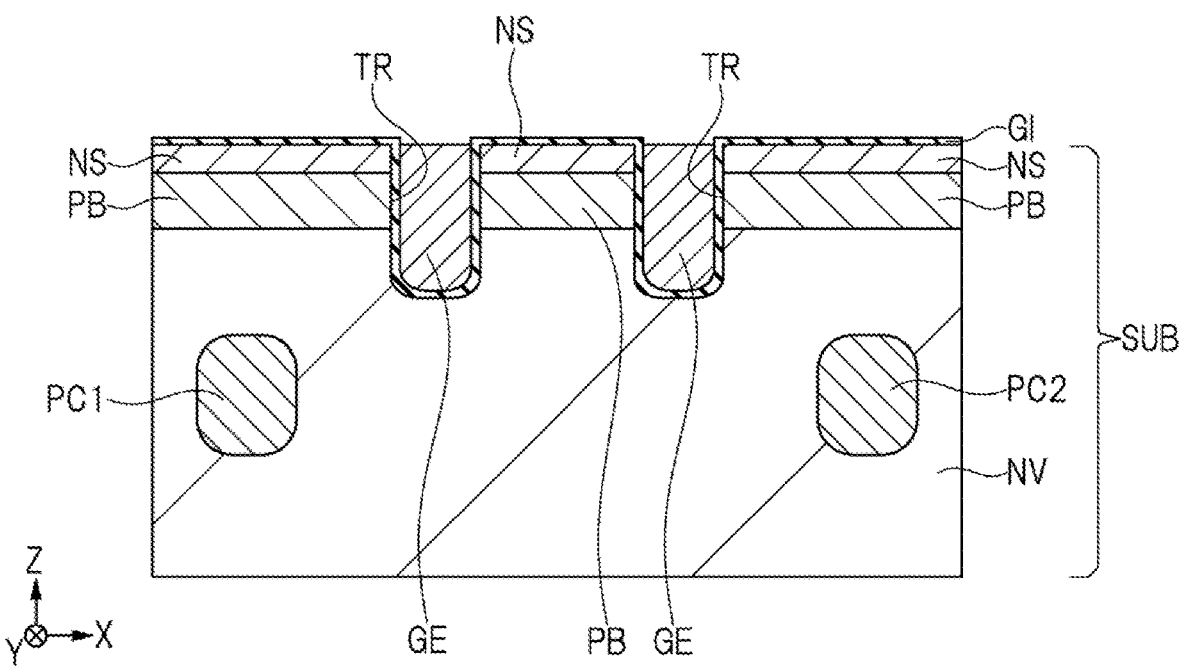
FIG. 9 is a cross-sectional view showing a manufacturing process following FIG. 8.

As shown in FIG. 9, a p-type body region PB is formed on a surface of the drift region NV, and an n-type source region NS is formed on a surface of the body region PB. First, the p-type body region PB is formed on the drift region NV by introducing a p-type impurity such as boron (B) by photolithography and ion implantation. Next, an n-type impurity such as arsenic (As) is introduced by photolithography and ion-implantation to form the n-type source region NS on the body region PB.

Figure 10:
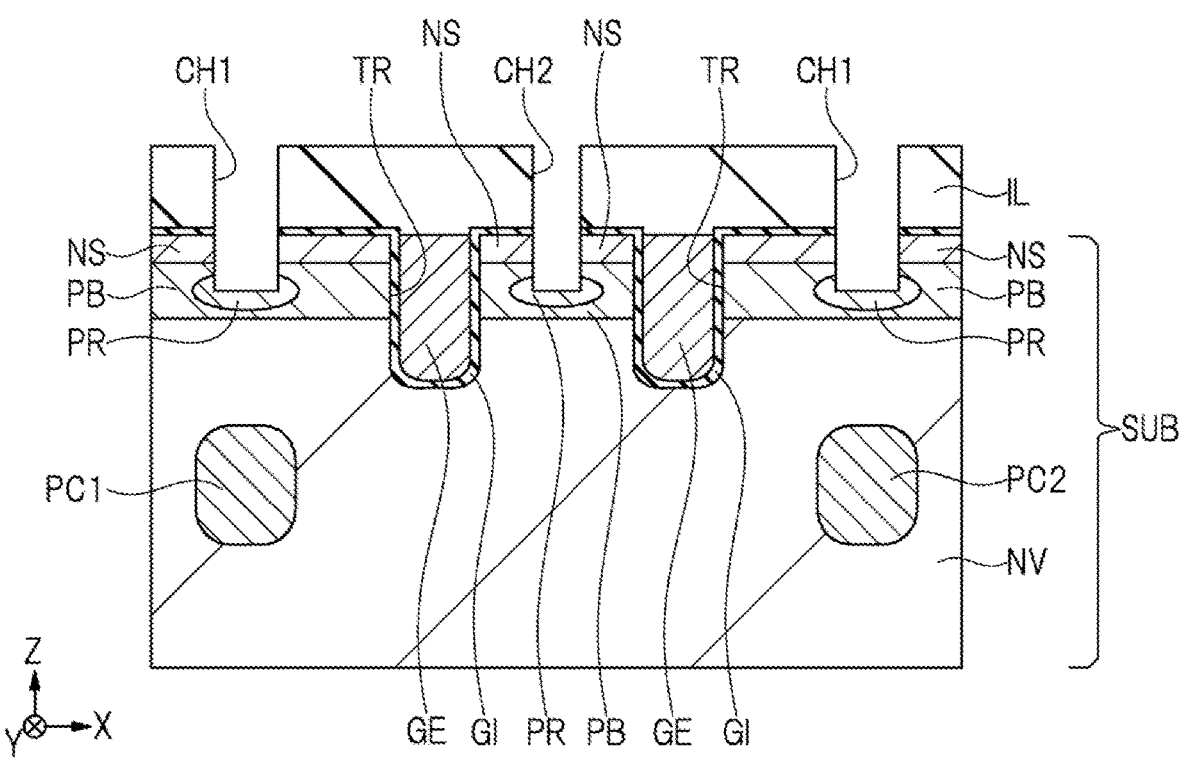
FIG. 10 is a cross-sectional view showing a manufacturing process following FIG. 9.

As shown in FIG. 10, an interlayer insulating film IL is formed on the semiconductor substrate SUB, a pair of holes CH1 and holes CH2 are formed in the interlayer insulating film IL, and a high concentration region PR is formed in the body region PB.

First, an interlayer insulating film IL made of, for example, a silicon oxide film is formed on the semiconductor substrate SUB by, for example, a CVD method so as to cover the pair of gate electrodes GE. Next, the pair of holes CH1 and holes CH2 that penetrate the interlayer insulating film IL and the source-region NS are formed by photolithography and dry-etching. The bottoms of each of the pair of holes CH1 and the hole CH2 are located in the body region PB. Next, a p-type impurity such as boron (B) is introduced at the bottom of each of the pair of holes CH1 and the hole CH2 by an ion-implantation method, thereby forming the p-type high-concentration region PR in the body region PB.

Note that the hole CH3 shown in FIG. 3 is also formed in the termination region 2A by the same step as the step of forming the pair of holes CH1 and the hole CH2. The hole CH3 is located on the gate electrode GE.

Figure 11:
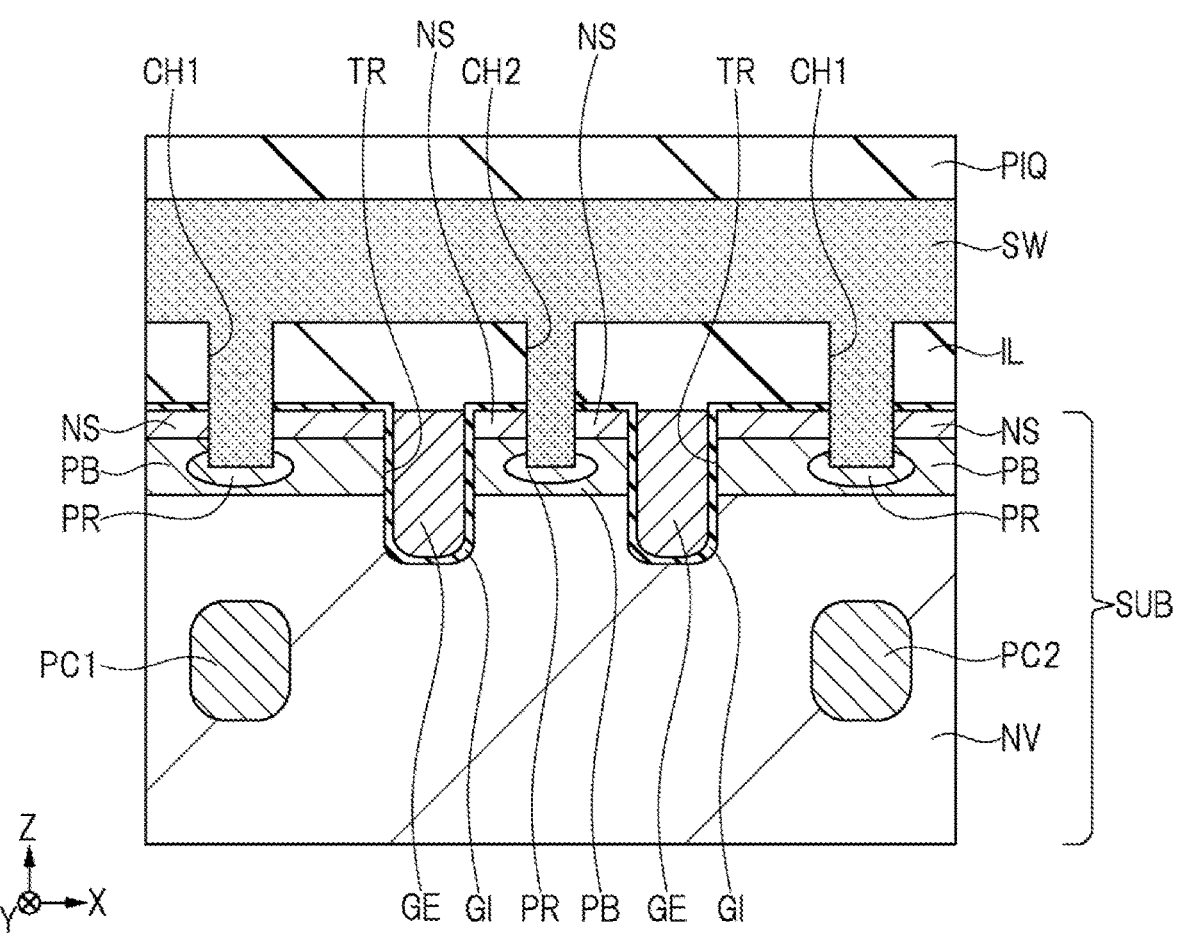
FIG. 11 is a cross-sectional view showing a manufacturing process following FIG. 10.

As shown in FIG. 11, a source wiring SW is formed on the interlayer insulating film IL, and a protective film PIQ is formed on the source wiring SW. First, the source-wiring SW is formed on the interlayer insulating film IL by a sputtering method or a CVD method so as to fill the inside of the pair of holes CH1 and the inside of the hole CH2. In the same step as the step of forming the source-wiring SW, the gate-wiring GW is also formed on the interlayer insulating film IL so as to fill the hole CH3.

Next, the protective film PIQ made of, for example, a polyimide film is formed on the source wiring SW and the gate wiring GW by, for example, a coating method. After that, although not shown, a part of the protective film PIQ is opened to expose regions to be a source pad and a gate pad on the source wire SW and the gate wiring GW.

After the manufacturing process of FIG. 11, the semiconductor device 100 shown in FIG. 4 is manufactured through the above-described process. First, a back surface of the semiconductor substrate SUB is polished as needed. Next, an n-type impurity such as arsenic (As) is introduced by an ion-implantation method to form an n-type drain-region ND on the back surface of the semiconductor substrate SUB. Next, a drain electrode DE is formed below the drain region ND by, for example, a sputtering method.

Figure 12:
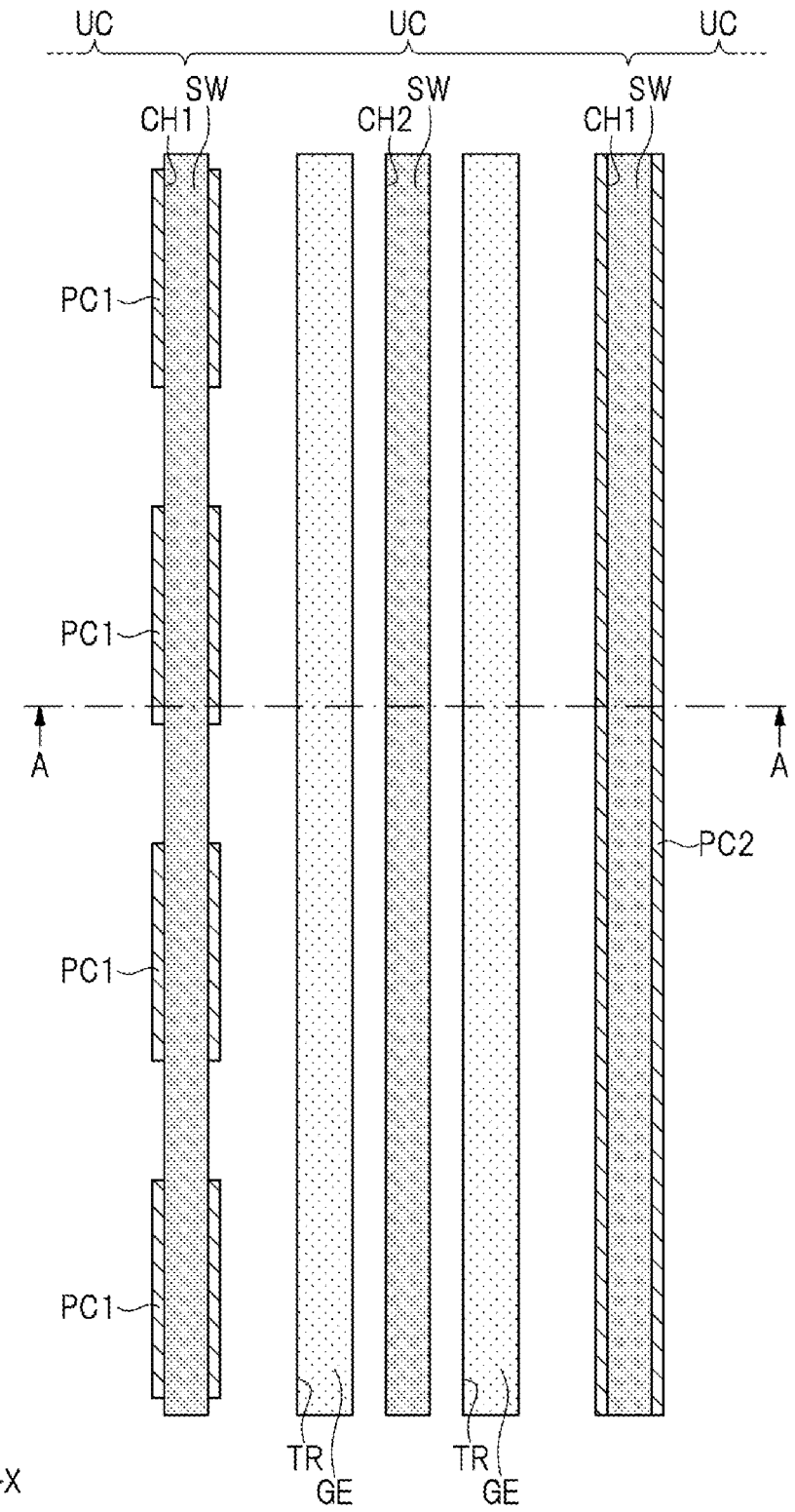
FIG. 12 is a main part plan view showing a semiconductor device in a second embodiment.

With reference to FIG. 12 below, a description will be given of a semiconductor device 100 according to the second embodiment. Note that, in the following description, differences from the first embodiment will be mainly described, and the description of overlapping points with the first embodiment will be omitted.

In the first embodiment, both the column region PC1 and the column region PC2 are divided into a plurality of portions. In the second embodiment, one of the column region PC1 and the column region PC2 is divided into a plurality of portions, but the other is not divided and has a stripe-like shape (a shape extending in the Y-direction). That is, the width of the other column region in the Y direction is sufficiently wider than the width L1 of the one column region in the Y direction.

FIG. 12 illustrates an example in which a plurality of column regions PC1 are divided. Here, the width of the column region PC2 in the Y direction is sufficiently wider than the width L1 of the column region PC1 in the Y direction. Therefore, the column region PC2 adjoins the plurality of column regions PC1 in the X-direction.

In the second embodiment, the on-resistance can be reduced without reducing the resistance of the drift-region NV, and a sufficiently high breakdown voltage can be ensured. The first embodiment is superior to the second embodiment in terms of reducing the on-resistance. In terms of securing the breakdown voltage, the second embodiment is superior to the first embodiment. Although priority is given to securing the breakdown voltage, when it is desired to realize a reduction in the on-resistance to some extent, it is preferable to apply the second embodiment.

Although the present invention has been described in detail based on the above-described embodiments, the present invention is not limited to the above-described embodiments, and can be variously modified without departing from the gist thereof.

What is claimed is:

1. A semiconductor device including a plurality of unit cells, each of the plurality of unit cells comprising:
   a semiconductor substrate having a drift region formed of a semiconductor layer of a first conductivity type;
   a body region of a second conductivity type opposite to the first conductivity type, formed on a surface of the drift region;
   a source region of the first conductivity type formed on a surface of the body region;
   a first column region and a second column region each of the second conductivity type formed in the drift region so as to be positioned under the body region and adjacent to and apart from each other in a first direction in a plan view;
   a pair of trenches formed between the first column region and the second column region in the first direction and formed in the drift region so that bottom portions of the pair of trenches reach a position deeper than the body region; and
   a pair of gate electrodes formed in the pair of trenches respectively via a gate insulating film,
   wherein the pair of trenches and the pair of gate electrodes extend in a second direction orthogonal to the first direction in a plan view,
   wherein a width of the first column region in the second direction is wider than a width of the first column region in the first direction,
   wherein a plurality of first column regions are formed along the second direction and to space from one another,
   wherein the plurality of first column regions and the plurality of second column regions are arranged in a staggered manner in a plan view, and
   wherein a part of one of the first column regions and a part of one of the second column regions are adjacent to each other in the first direction.

2. The semiconductor device according to claim 1, wherein the width of the first column region in the second direction is not less than twice the width of the first column region in the first direction.

3. The semiconductor device according to claim 1, wherein a distance at which the plurality of first column regions are spaced apart from each other is shorter than a width of one of the first column regions in the second direction.

4. The semiconductor device according to claim 2, wherein a width of the second column region in the second direction is wider than a width of the second column region in the first direction, wherein a plurality of the second column regions are formed while being separated from each other along the second direction, and wherein a distance at which the plurality of second column regions are separated from each other is shorter than a width of one of the second column regions in the second direction.

5. The semiconductor device according to claim 4, wherein a width of the second column region in the second direction is not less than twice a width of the second column region in the first direction.

6. The semiconductor device according to claim 1, wherein a distance at which the plurality of first column regions are separated from each other is shorter than a distance between the first column region and the second column region in the first direction, and wherein the distance is longer than a value obtained by subtracting a width of each of the pair of trenches in the first direction from a distance between the first column region and the second column region in the first direction.

7. The semiconductor device according to claim 1, wherein the second column region extends in the second direction and is adjacent to the plurality of first column regions in the first direction.

8. The semiconductor device according to claim 1, wherein each of the plurality of unit cells further includes:

an interlayer insulating film formed on the semiconductor substrate so as to cover the pair of gate electrodes, a first hole penetrating the interlayer insulating film and the source region so that a bottom portion thereof is located in the body region, and a source wiring formed on the interlayer insulating film so as to fill the first hole, and wherein the first hole extends in the second direction so as to overlap the plurality of first column regions in a plan view.

\* \* \* \* \*